United States Patent

Berezin

(10) Patent No.: US 6,750,490 B2
(45) Date of Patent: Jun. 15, 2004

(54) PINNED FLOATING PHOTORECEPTOR WITH ACTIVE PIXEL SENSOR

(75) Inventor: Vladimir Berezin, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/443,839

(22) Filed: May 23, 2003

(65) Prior Publication Data

US 2003/0201509 A1 Oct. 30, 2003

Related U.S. Application Data

(62) Division of application No. 10/278,395, filed on Oct. 22, 2002, now Pat. No. 6,677,628, which is a continuation of application No. 09/397,381, filed on Sep. 16, 1999, now Pat. No. 6,469,332.

(60) Provisional application No. 60/100,751, filed on Sep. 16, 1998, and provisional application No. 60/106,466, filed on Oct. 30, 1998.

(51) Int. Cl.[7] ............................................. H01L 31/062
(52) U.S. Cl. ...................... 257/292; 257/233; 257/290; 257/291; 257/432; 257/461; 438/60; 250/208.1; 250/214.1; 348/298; 348/308
(58) Field of Search ................................ 257/290–292, 257/233, 432, 443, 461; 438/60, 66, 69; 250/208.1, 214.1; 348/294, 298, 308, 311, 313

(56) References Cited

U.S. PATENT DOCUMENTS

| 4,450,466 A | | 5/1984 | Nishizawa et al. |
| 4,912,537 A | | 3/1990 | Boyd |
| 4,984,047 A | * | 1/1991 | Stevens ....................... 257/223 |
| 5,043,783 A | * | 8/1991 | Matsumoto et al. ......... 257/461 |
| 5,235,196 A | * | 8/1993 | Anagnostopoulos et al. ........................... 257/223 |
| 5,563,429 A | | 10/1996 | Isogai |
| 5,625,210 A | | 4/1997 | Lee et al. |
| 5,942,774 A | | 8/1999 | Isogai et al. |

FOREIGN PATENT DOCUMENTS

JP          10209422 A    *  8/1998    ......... H01L/27/146

* cited by examiner

*Primary Examiner*—George Eckert
(74) *Attorney, Agent, or Firm*—Dickstein Shapiro Morin & Oshinsky LLP

(57) ABSTRACT

A pinned photodiode is operated without a transfer gate. This is done by forming a pinned photodiode which has a selective connection to the substrate. When the connection is turned on, the photodiode is pinned to the substrate, and kept at a specified potential. When the connection is off, the photodiode is disconnected from the substrate and hence floats. In this way, the area above the photoreceptor can be used both for a reception area and for a charge transfer area.

9 Claims, 5 Drawing Sheets

PINNED FLOATING PHOTORECEPTOR WITH ACTIVE PIXEL SENSOR

CROSS REFERENCE TO RELATED APPLICATIONS

This application is a divisional of application Ser. No. 10/278,395, filed Oct, 22, 2002, now U.S. Pat. No. 6,677,628, which is a continuation of Ser. No. 09/397,381, filed Sep. 16, 1999, now U.S. Pat. No. 6,469,332, which claims benefit of provisional applications 60/100,751, filed Sep. 16, 1998 and 60/106,466, filed Oct. 30, 1998. Each of the applications identified in this paragraph are incorporated by reference herein.

The present disclosure describes a specific way of using a pinned photodiode in an active pixel sensor array.

BACKGROUND

U.S. Pat. No. 5,625,210 describes using a pinned photodiode in an active pixel sensor array. This patent describes certain advantages which are obtained from using a pinned photodiode in such a sensor. These advantages are well known in the field of pinned photodiodes. One advantage is better photogenerated carrier collection, which leads to improved blue response, less dark current generation, and improved charge transfer from the photosensitive element to its receptor.

A conventional diode has n doped region formed at the surface of the device. The p-doped area surrounds the n-doped area.

A pinned photodiode has n type material and a p-n junction that is buried below the surface. This has certain advantages. Since the potential on the n-junction is below the surface, it avoids current on the surface. The dark current is reduced. Moreover, since the pn junction is buried, there is less photocombination or photorecombination, thereby improving the blue response.

Moreover, since the active area is buried in the dark current generator, it becomes easier to transfer the charge. The charge can be transferred using CCD techniques. This can result in 99.99% charge transfer efficiency.

This buried surface above the photodetector forms a virtual gate which is pinned to substrate potential, usually ground potential. Pinning this surface to V=0 reduces noise. However, it becomes more difficult to transfer the charge that is stored in the photoreceptor into the desired area for charge reconstruction.

U.S. Pat. No. 5,625,210 teaches using a pinned photodiode in an active pixel sensor. This uses a separate transfer gate to transfer the charge as shown in FIG. 1. The photodiode has a virtual gate 102. Transfer gate 104 transfers the charge from the photodiode 100 into a floating diffusion 106. A second transfer gate 108 is connected to a reset line 110.

SUMMARY

The present system defines a different way of making and operating a variation on a pinned photodiode. This is done without a transfer gate. A floating gate is used to transfer the charge from the photodiode to a receptor area.

The surface "pinned" region above the charge integration well is floating during readout, but is pinned to the substrate during the integration time. Hence, this system is only partially pinned. During integration time, the device operates as a pinned photodiode with many of the advantages of a pinned photodiode. During the charge integration time, the surface floats.

This operation allows certain advantages. The prior art pinned photodiodes, as described above, require separate integration and readout regions. Both of these regions need to be substantially the same size. The charge is integrated in the integration region, and then transferred by the transfer gate to the readout region.

In contrast, the system described according to the present embodiment uses the same region both for the readout region and for the photosensitive region.

In addition, the system defined according to the present specification does not require a transfer gate. This can further reduce the size of the device. The system also does not require a special contact between the floating node and the gate of the output transistor.

Finally, while the system described in the prior art reads out a negative voltage, the system according to the present invention reads out a positive voltage. This may be more convenient for certain operations.

BRIEF DESCRIPTION OF THE DRAWINGS

These and other aspects of the invention will now be described with reference to the attached drawings, in which.

DESCRIPTION OF THE EMBODIMENTS

Figure 1:
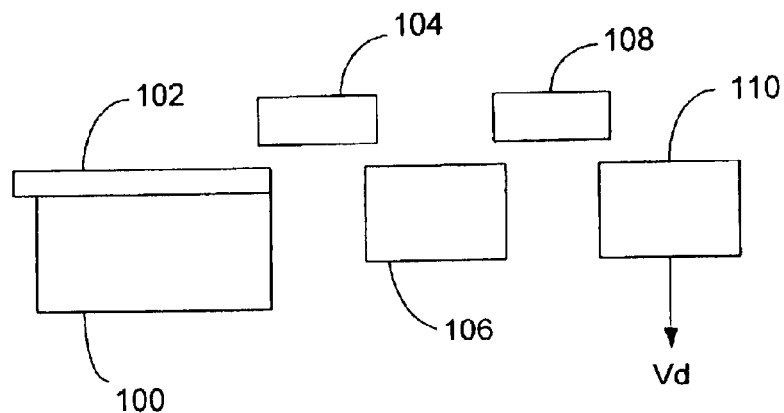
FIG. 1 shows a connection to a convention pinned photodiode.
Figure 2:
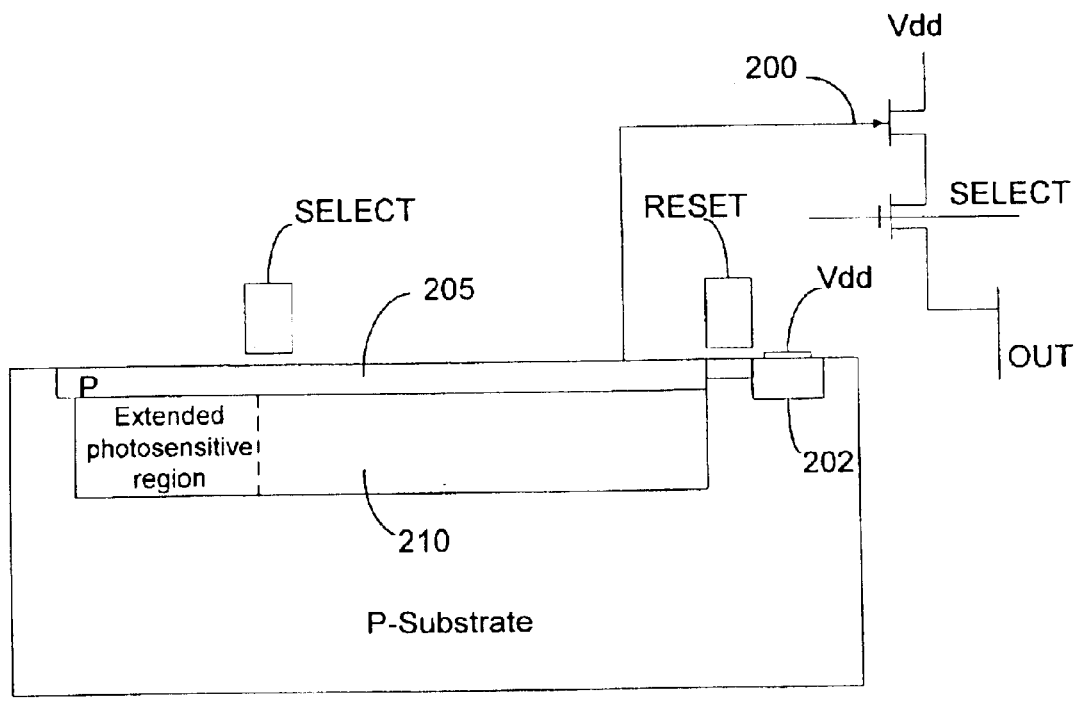
FIG. 2 shows a layout of the element.

A basic block diagram of the embodiment is shown in FIG. 2 which shows a pinned photodiode 210 with a virtual floating gate 205. During readout time, the gate 205 is allowed to float. This helps to remove the charge from the photoreceptor. However, during the integration time, the gate 205 is kept at surface potential, in order to obtain the noise advantages of a virtual floating gate 205.

The transistor 200 represents a connection to a reset voltage. The reset voltage is initially applied to the floating gate 205. Another connection 202 may be necessary to reset the charge in the floating gate 205 which is biased to an appropriate level.

The floating gate 205 is initially reset while the substrate is floating, not pinned. Then the photodiode 210 is pinned to the surface potential. This produces the advantages described that are possible from such pinning as described above. During the time of pinning, the incoming charge is integrated in the photosensitive region 210. Since the well 210 has been charged first, the incoming charge from photocarriers received by photodiode 210 can increase the voltage in the Floating Gate 205.

During the time of readout, the gate 205 is separated from the substrate and allowed to float. This allows the charge to be read out as the $^aV$ between the reset level and the readout level. That $^av$ represents the increase in charge attributed to the photocarriers.

Figure 3:
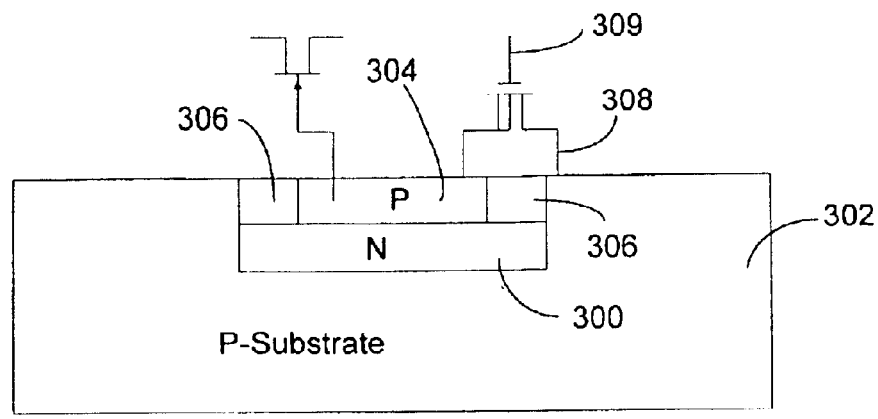
FIG. 3 shows a simplified diagram of the diode.

This modified pinned photodiode structure is shown in simplified form in FIG. 3. The photoreceptor area 300 is still buried in the p-substrate 302. There is an overlying p-substrate 304. The part 304 that buries the n-well 300 is isolated from the rest 302 of the p-substrate by a barrier 306.

The barrier 306 surrounds the pinned part of the layer 304 and thereby isolates pinned layer 304 from the rest of the substrate 302. Structure also exists, shown as element 308, for selectively connecting the pinned layer 304 to the rest of the substrate 302 based on a command on line 309. A controller produces this command at appropriate times during the readout sequence. The pinned layer 304 is hence pinned at some times, and not pinned or ⌐floating@ at other times.

Figure 4D:
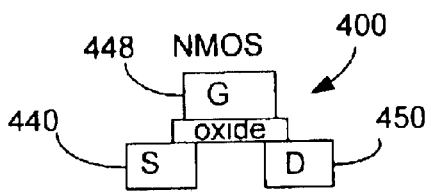
FIGS. 4A–4D show a more detailed diagram of the pinned photodiode and its connection.
Figure 4A:
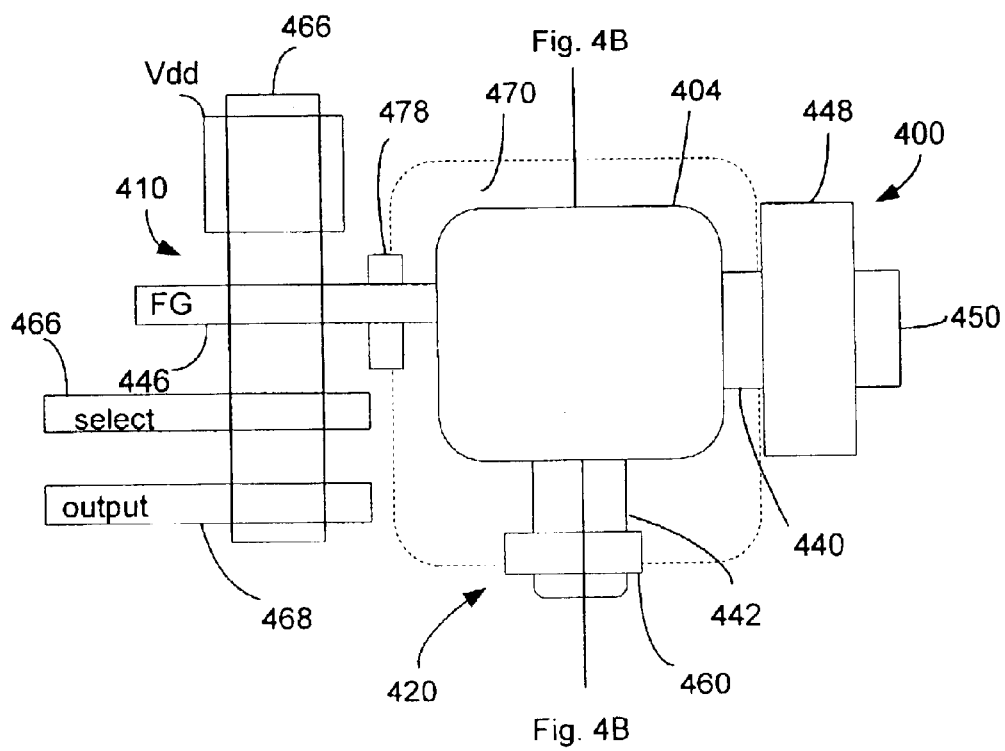

A more detailed diagram of the pinned photodiode is shown in FIGS. 4A–4D. FIG. 4A shows the pinned layer 404 from the top. The pinned layer 404 includes connections to three transistors 400, 410, and 420. These three transistors 400, 410, 420 form the switching for operation of this circuit. One connection via transistor 400 is to the reset node. Another connection via transistor 410 is to the source follower. A third connection via transistor 420 is to selectively "pin" the pinned layer 404 to substrate potential.

The pinned layer 404 shown in FIG. 4A is substantially in the shape of a desired layer, here a rectangle with peninsulas 440, 442, 446 forming the contact portion for the transistors 400, 410, 420. The peninsula 440 is overlaid by a gate structure 448. This gate structure 448 is connected to a drain structure 450 which is maintained at the potential Vdd. The gate 448 can be appropriately biased to turn on the transistor 400 and thereby connect the appropriate structure to Vdd for reset.

Figure 4B:
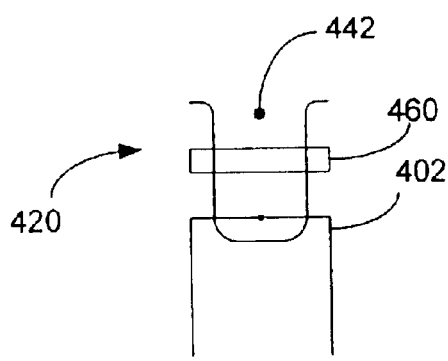

A view of a cross section along the line 4B—4B is shown in FIG. 4B. This shows the source, the drain, the gate, and gate oxide forming that connection.

Similarly and in an analogous way, the peninsula 442 is connected via a gate 460 to the substrate 402 which forms the drain of that transistor. Also analogously, the peninsula 446 is connected to a gate 466, and to the drain which forms the output 468.

Preferably, the transistor 400 is an NMOS transistor, the transistor 410 is a JFET to avoid contact between the pinned layer 404 and the output 468, and the transistor at 420 is a PMOS transistor.

The pinned layer 404 is surrounded by a depletion layer 470 which forms a barrier 306 all the way around the pinned layer 404. The barrier 470 is broken at the gates 448, 460, and possibly also in the transistor 410. The barrier 470 extends right up to the gate in other places, thereby isolating the pinned layer 404 from the substrate 302 except when the connection of transistor 420 becomes active.

Figure 4C:
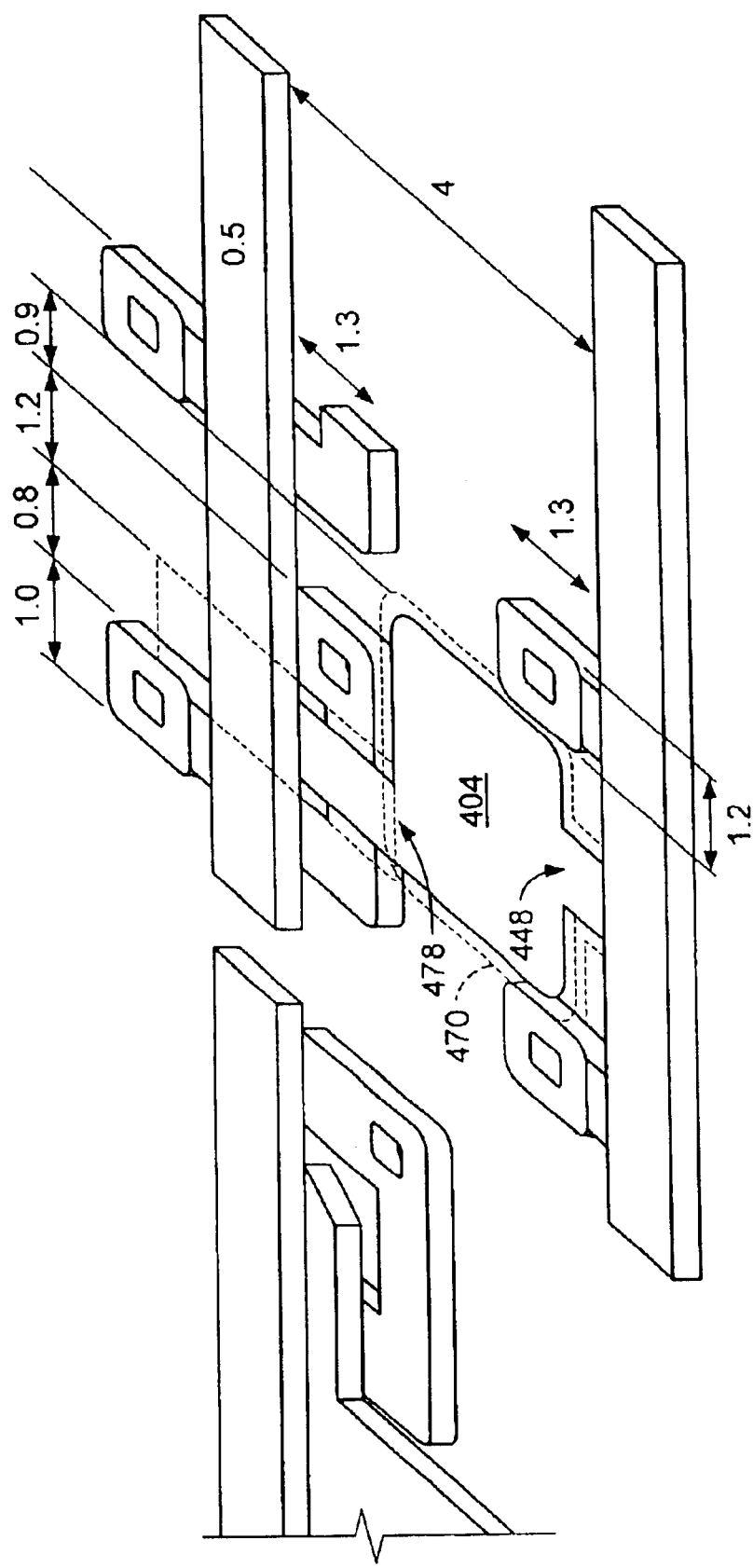
Figure 6:
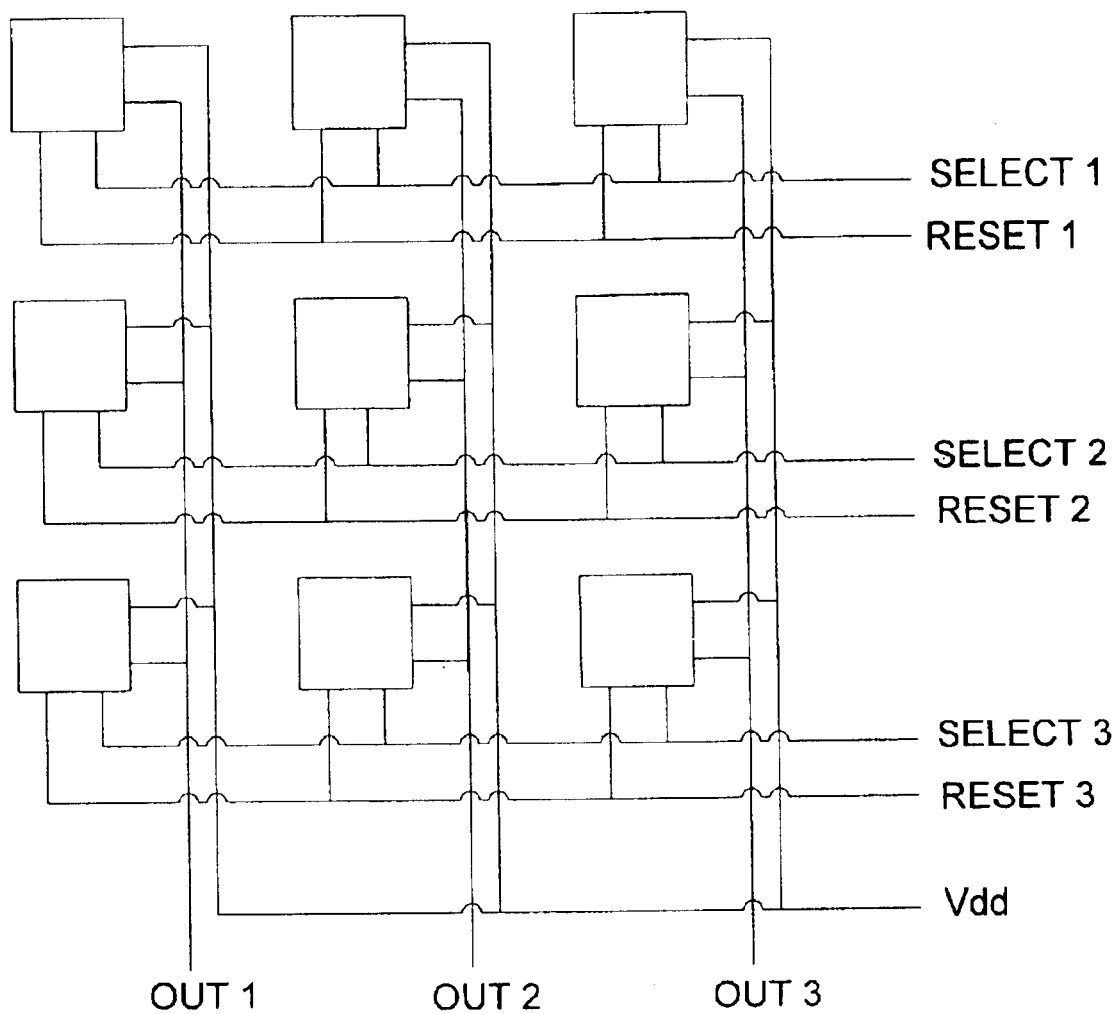
FIG. 6 shows an array of sensors in accordance with the teachings of the invention.

FIG. 4C illustrates a perspective view of the pinned photodiode. The depletion layer 470 encompasses the pinned layer 404 forming a barrier. Gate structures 448 and 478 overlay peninsular regions of the main body of the pinned layer 404.

FIG. 4D illustrates a cross-sectional view of NMOS transistor 400. An oxide layer separates the gate 448 from the peninsula 440 and the drain 450. The peninsula 440 forms the source of transistor 400.

The diffusions will inherently have a depletion layer around them, thereby providing that isolation. An additional barrier 478 may need to be formed between the pinned layer 404 and the JFET 410 since these two channels may need to be separated.

Figure 5A:
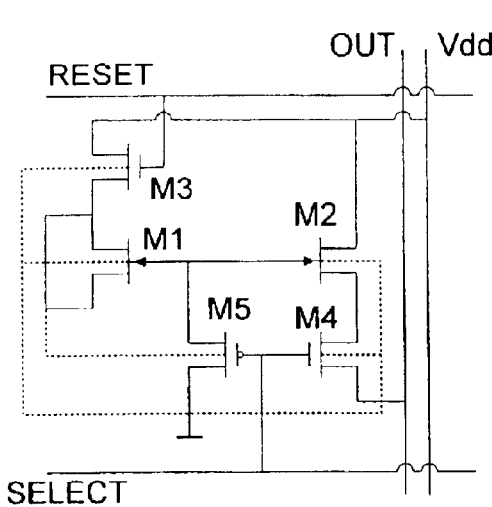
FIGS. 5A and 5B show equivalent schematics.
Figure 5B:
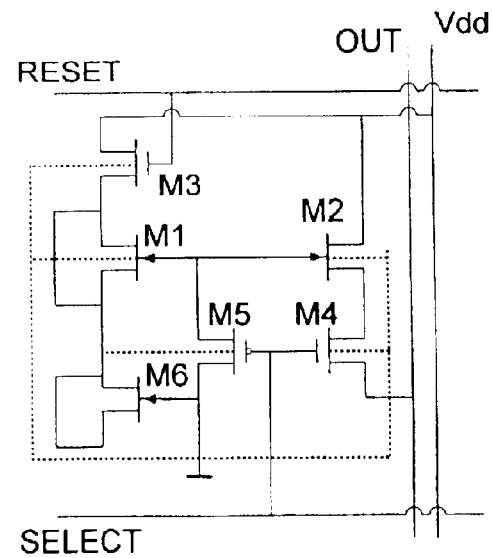

Schematic diagrams of the equivalent circuits are shown in FIGS. 5A and 5B.

Although only a few embodiments have been described in detail above, those of ordinary skill in the art will understand that modifications are possible without departing from the teaching noted above.

What is claimed is:

1. A method of operating a pixel having a photosensitive region on a substrate positioned under a surface region; said method comprising:
   maintaining a potential of the surface region as floating in a first operating mode; and
   pinning the voltage level of the surface region to a substrate voltage in a second operating mode.

2. The method of claim 1, further comprising applying a reset voltage to the surface region.

3. The method of claim 1, further comprising accumulating photo-generated charge in the photosensitive region in the second mode.

4. The method of claim 3, further comprising floating the surface region and reading an amount of photo-generated charge accumulated in the photosensitive region.

5. The method of claim 1, further comprising controlling switching elements to respectively float and pin the voltage level of the surface region in said first and second operating modes.

6. A method of forming a photoreceptor, comprising:
   forming a well in a substrate;
   forming a photoreceptor in the well of the substrate;
   forming a surface region over the photoreceptor; and
   forming a device on the substrate operable to selectively connect the surface region to the substrate.

7. The method of claim 6, further comprising forming a device on the substrate operable to selectively connect the surface region to a voltage source.

8. The method of claim 6, further comprising forming a device on the substrate operable to selectively connect the surface region to an output terminal.

9. The method of claim 6, further comprising forming a barrier region between the surface region and the substrate.

* * * * *